US008552478B2

(12) United States Patent
Wu et al.

(10) Patent No.: US 8,552,478 B2
(45) Date of Patent: Oct. 8, 2013

(54) CORNER TRANSISTOR AND METHOD OF FABRICATING THE SAME

(75) Inventors: Tieh-Chiang Wu, Yilan County (TW); Yu-Teh Chiang, Taipei (TW); Yu-Wei Ting, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 27 days.

(21) Appl. No.: 13/174,800

(22) Filed: Jul. 1, 2011

(65) Prior Publication Data

US 2013/0001658 A1  Jan. 3, 2013

(51) Int. Cl.
*H01L 29/78* (2006.01)
*H01L 21/336* (2006.01)

(52) U.S. Cl.
USPC ............... 257/288; 257/396; 257/E21.409; 257/E29.255; 438/294; 438/585; 438/589; 438/595

(58) Field of Classification Search
USPC .......................................................... 257/288
See application file for complete search history.

(56) References Cited

U.S. PATENT DOCUMENTS

| 4,863,562 | A | * | 9/1989 | Bryant et al. | ............. | 438/445 |
| 2004/0080019 | A1 | | 4/2004 | Oh et al. | | |
| 2005/0077570 | A1 | * | 4/2005 | Nishinohara | ............. | 257/336 |
| 2005/0167777 | A1 | * | 8/2005 | Lee | ............. | 257/510 |
| 2007/0215936 | A1 | * | 9/2007 | Ko et al. | ............. | 257/327 |
| 2007/0235835 | A1 | * | 10/2007 | Ko et al. | ............. | 257/510 |
| 2008/0224252 | A1 | * | 9/2008 | Suguro et al. | ............. | 257/499 |

FOREIGN PATENT DOCUMENTS

| JP | 6-268174 | 9/1994 |
| JP | 2007184518 | 7/2007 |
| JP | 2007201396 | 8/2007 |

OTHER PUBLICATIONS

"Office Action of Germany counterpart application" issued on Apr. 5, 2012, p. 1-p. 4.
"Office Action of Japan counterpart application" issued on May 28, 2013, p. 1-p. 2.

* cited by examiner

*Primary Examiner* — Angel Roman
(74) *Attorney, Agent, or Firm* — Jianq Chyun IP Office (57) ABSTRACT

A method of fabricating a corner transistor is described. An isolation structure is formed in a substrate to define an active region. A treating process is performed to make the substrate in the active region have sharp corners at top edges thereof. The substrate in the active region is covered by a gate dielectric layer. A gate conductor is formed over the gate dielectric layer. A source region and a drain region are formed in the substrate beside the gate conductor.

20 Claims, 7 Drawing Sheets

CORNER TRANSISTOR AND METHOD OF FABRICATING THE SAME

BACKGROUND OF THE INVENTION

1. Field of Invention

This invention relates to a semiconductor device and the fabrication thereof, and particularly relates to a corner transistor and a method of fabricating the same.

2. Description of Related Art

To meet the requirement on miniaturization of electronic products, the sizes of devices and the inter-device distances in integrated circuits are reduced correspondingly. However, the device size or distance cannot be reduced arbitrarily, and the reduction is limited by certain issues caused by device miniaturization.

For a transistor as a fundamental device of ICs, its dimension is reduced usually by reducing the length of its gate conductor. However, certain types of transistors require relatively high voltages in their operations. Hence, the reduction of the device size (gate length) is greatly limited.

SUMMARY OF THE INVENTION

Accordingly, this invention provides a corner transistor that has an improved performance and can have a reduced size.

This invention also provides a method of fabricating a corner transistor, which improves the performance of the transistor and can reduce the size of the same through a simple process.

The method of fabricating a corner transistor of this invention is described as follows. An isolation structure is formed in a substrate to define an active area. A treating process is performed to make the substrate in the active area have sharp corners at the top edges thereof. The substrate in the active area is covered by a gate dielectric layer. A gate conductor is formed over the gate dielectric layer. A source region and a drain region are formed in the substrate beside the gate conductor.

In an embodiment, the treating process comprises making the top surface of the substrate in the active area have a curved shape.

In an embodiment, the treating process comprises the steps below. A thermal oxidation process is performing to oxidize the surface of the substrate in the active area and form an oxide layer with a curved profile. Then, the oxide layer and a portion of the isolation structure are removed so that the surface of the substrate in the active area and the sharp corners are protrudent over the surface of the isolation structure. The gate dielectric layer may also cover the sharp corners. The treating process may further comprise performing a first etching process to remove a portion of the substrate in the active area, such that the surface of the remaining substrate in the active area is lower than the surface of the isolation structure and a trench is formed thereby. The first etching process may comprise an anisotropic etching process.

The treating process may further comprise, after the first etching process is performed, performing a second etching process to remove a portion of the isolation structure at the sidewalls of the trench so that the surface of the remaining substrate in the active area and the sharp corners are protrudent over the bottom of the trench. The second etching process may comprise an isotropic etching process. The gate dielectric layer may also cover the sharp corners.

In an embodiment, the treating process comprises performing a first etching process to remove a portion of the substrate in the active area, such that the surface of the remaining substrate in the active area is lower than that of the isolation structure and a trench is formed thereby. The first etching process may comprise an anisotropic etching process.

The treating process may further comprise, after the first etching process is performed, performing a second etching process to remove a portion of the isolation structure at the sidewalls of the trench so that the surface of the remaining substrate in the active area and the sharp corners are protrudent over the bottom of the trench. The second etching process may comprise an isotropic etching process. The gate dielectric layer may also cover the sharp corners.

The corner transistor of this invention comprises a substrate, a gate dielectric layer, a gate conductor, a source region and a drain region. The substrate has therein an isolation structure defining an active area, wherein the substrate in the active area have sharp corners at two edges thereof The gate dielectric layer covers the substrate in the active area. The gate conductor is disposed over the gate dielectric layer. The source region and the drain region are in the substrate beside the gate conductor.

In an embodiment, the top surface of the substrate in the active area and the sharp corners are protrudent over the surface of the isolation structure.

In an embodiment, the top surface of the substrate in the active area is lower than the top surface of the isolation structure so that a trench is formed exposing the top surface of the substrate in the active area.

In an embodiment, the top surface of the substrate in the active area is lower than the top surface of the isolation structure so that a trench is formed and the top surface of the substrate in the active area and the sharp corners are protrudent over the bottom of the trench. The gate dielectric layer may also cover the sharp corners.

In an embodiment, the top surface of the substrate in the active area has a curved shape.

Accordingly, the corner transistor of this invention can have a trench-type gate conductor to reduce the device size. Moreover, since the substrate between the source region and the drain region has sharp corners and the gate conductor can cover the sharp corners, the device performance can be improved.

On the other hand, through a simple process, the method of fabricating a corner transistor of this invention can form a trench-type gate conductor that allows reduction of the device size easily, and also form sharp corners on the substrate between the source region and the drain region and make the gate conductor cover the sharp corners to improve the device performance.

In order to make the aforementioned and other objects, features and advantages of this invention comprehensible, a preferred embodiment accompanied with figures is described in detail below.

BRIEF DESCRIPTION OF THE DRAWINGS

FIG. 1D-1 illustrates, in a cross-sectional view along the line II-II in FIG. 1, the corner transistor according to the first embodiment of this invention.

FIG. 1D-2 illustrates, in a cross-sectional view along the line II-II in FIG. 1, another corner transistor according to the first embodiment of this invention.

FIG. 2C-1 illustrates, in a cross-sectional view along the line II-II in FIG. 1, the corner transistor according to the second embodiment of this invention.

FIG. 3D-1 illustrates, in a cross-sectional view along the line II-II in FIG. 1, the another corner transistor according to the second embodiment of this invention.

DESCRIPTION OF EMBODIMENTS

This invention is further explained with the following embodiments referring to the accompanying drawings, which are not intended to limit the scope of this invention.

Figure 1:
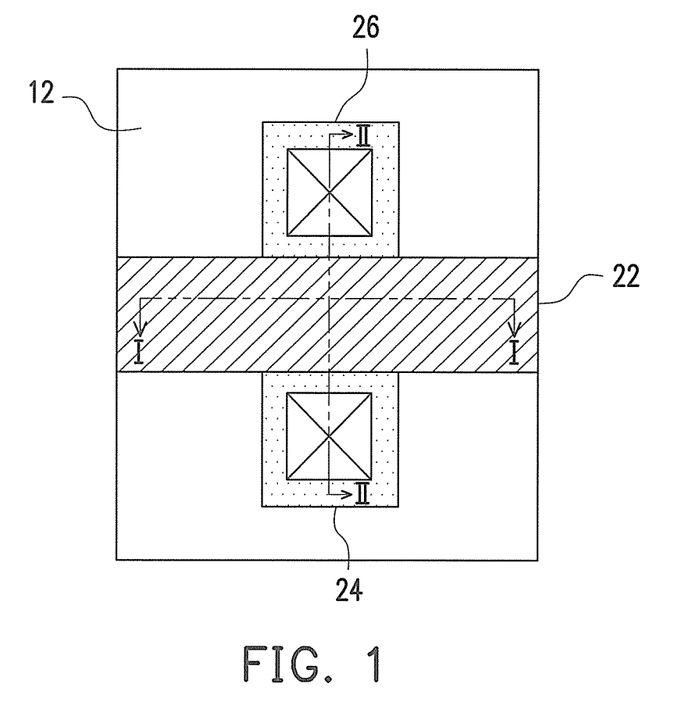
FIG. 1 illustrates a top view of a corner transistor according to an embodiment of this invention.

FIG. 1 illustrates a top view of a corner transistor according to an embodiment of this invention. FIGS. 1A-1D illustrate, in a cross-sectional view along the line I-I in FIG. 1, a method of fabricating a corner transistor according to a first embodiment of this invention. FIG. 1D-1 illustrates, in a cross-sectional view along the line II-II in FIG. 1, the corner transistor according to the first embodiment of this invention.

Figure 1A:
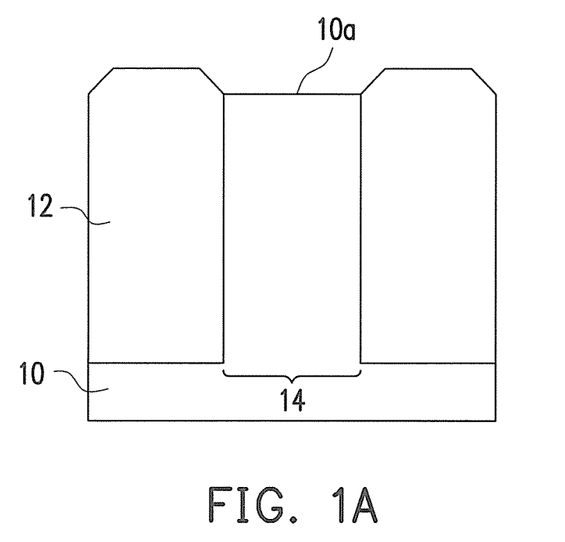
FIGS. 1A-1D illustrate a method of fabricating a corner transistor according to a first embodiment of this invention, in a cross-sectional view along the line I-I in FIG. 1.

Referring to FIG. 1A, an isolation structure 12 is formed in the substrate 10 to define an active area 14. The isolation structure 12 may be formed with a well known STI (shallow trench isolation) process, and includes an insulating material, for example, silicon oxide.

Figure 1B:
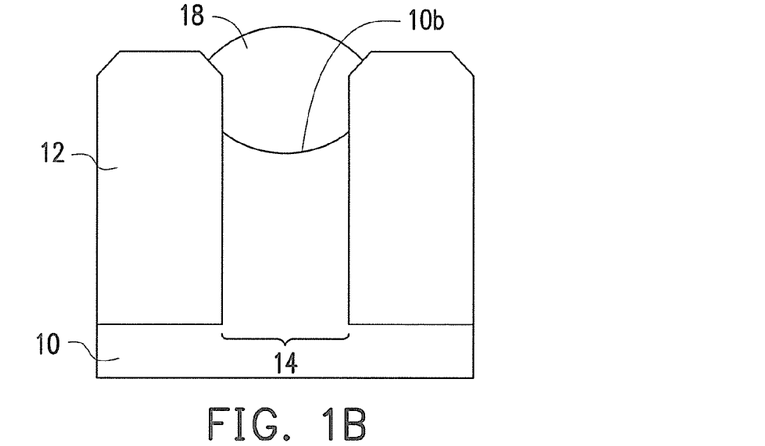
Figure 1C:
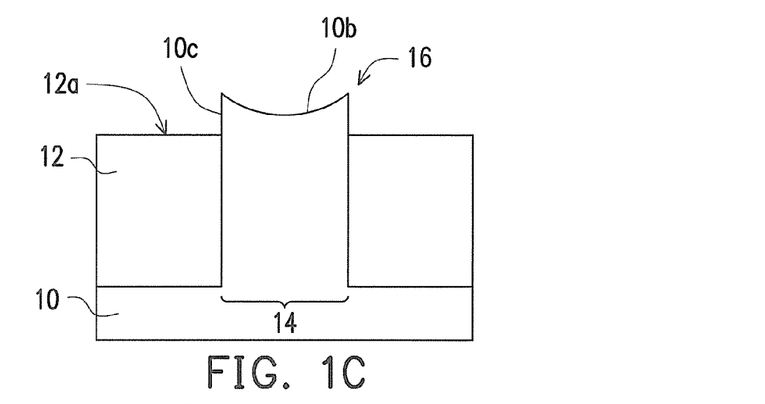
Figure 1D:
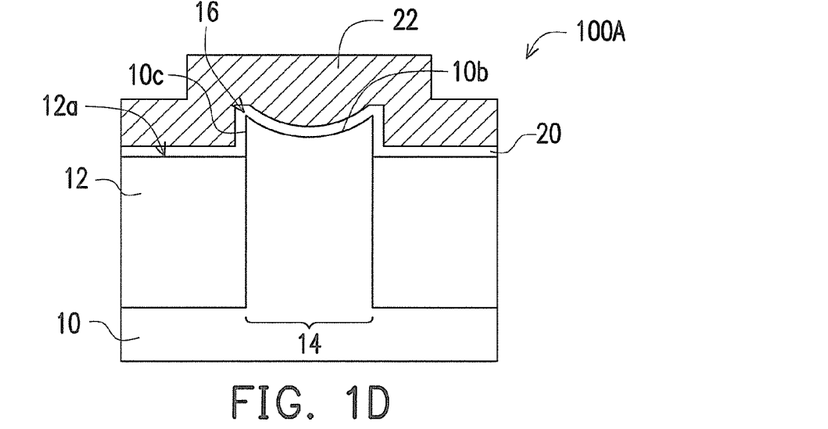

After the substrate regions for forming the source region 24 and the drain region 26 are masked by a mask layer (not shown), referring to FIGS. 1B-1C, a treating process is performed to make the substrate 10 in the active area 14 have sharp corners 16 at two edges thereof adjacent to the isolation structure 12. In this embodiment, the treating process includes two stages. In the first stage, a thermal oxidation process is performed to oxidize the top surface 10a of the substrate 10 in the active area 14 and thereby form an oxide layer 18 with a curved profile.

Referring to FIG. 1C, the second stage of the treating process includes removing the oxide layer 18 with the curved profile and a portion of the isolation structure 12 so that the top surface 10b of the substrate 10 in the active area 14 and the sharp corners 16 are protrudent over the top surface 12a of the isolation structure 12. The term "sharp corner" means that the angle formed by the top surface 10b and a sidewall 10c of the substrate 10 in the active area 14 is a sharp angle. The sharp corners 16 extend toward the upper space of the substrate 10, and are protrudent over the top surface 12a of the isolation structure 12. The method of removing the oxide layer 18 and a portion of the isolation structure 12 may include an anisotropic etching process, e.g., a dry etching process. In this embodiment, the exposed top surface 10b of the substrate 10 in the active area 14 has a curved shape after the oxide layer 18 with the curved profile is removed. However, this invention is not limited thereto, and may utilize any alternative removal process capable of forming sharp corners on the substrate 10 in the active area 14.

Figure 1D:
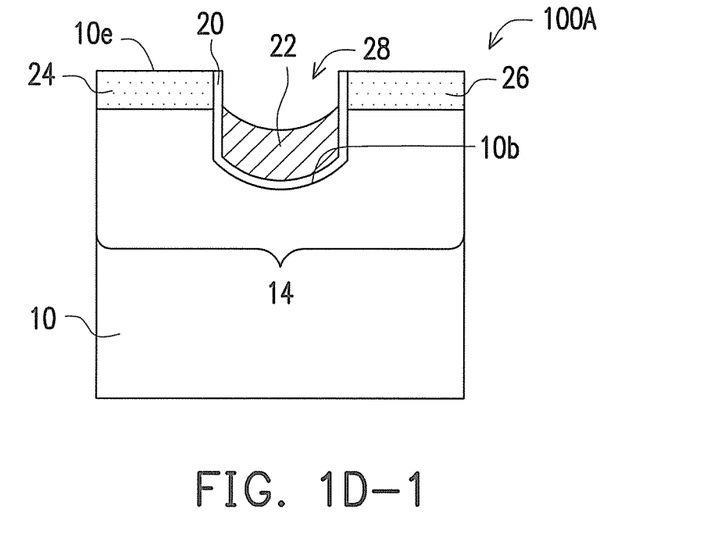

Referring to FIGS. 1, 1D and 1D-1, a gate dielectric layer 20 is then for red over the substrate 10 covering the exposed surfaces of the substrate 10 in the active area 14 that include the top surface 10b and the sharp corners 16. A patterned gate conductor 22 is then formed over the gate dielectric layer 20 and the isolation structure 12. A source region 24 and a drain region 26 are then formed in the substrate 10 beside the gate conductor 22. The gate dielectric layer 20 may include silicon oxide, SiON or metal oxide, may be formed with thermal oxidation or deposition. The gate conductor 22 may include doped poly-Si, and may be formed by forming an undoped poly-Si layer with chemical vapor deposition (CVD) and then implanting ions in the same. The gate conductor 22 may alternatively be formed with a CVD process with in-situ doping. The patterned gate conductor 22 can be defined by a lithography process and an etching process.

The corner transistor 100A formed in the above embodiment includes a substrate 10, a gate dielectric layer 20, a gate conductor 22, a source region 24 and a drain region 26. The substrate 10 has therein an isolation structure 12 that defines an active area 14. The gate dielectric layer 20, the gate conductor 22, the source region 24 and the drain region 26 are all in the active area 14. In the active area 14, the top surface 10b of the substrate 10 between the source region 24 and the drain region 26 is lower than the top surfaces 10e of the source region 24 and the drain region 26, so that the source region 24, the drain region 26 and the substrate 10 between them form a trench 28, wherein the top surface 10b of the substrate 10 is the bottom of the trench 28. On the other hand, the top surface 10b of the substrate 10 between the source region 24 and the drain region 26 is higher than the top surface 12a of the isolation structure 12 due to the masking of the mask layer in the formation of the oxide layer 18, and the substrate 10 between the source region 24 and the drain region 26 has sharp corners 16. Hence, the top surface 10b of the substrate 10 between the source region 24 and the drain region 26 and the sharp corners 16 are protrudent over the surface 12a of the isolation structure 12. The gate conductor 22 is disposed over the gate dielectric layer 20 and the isolation structure 12, and covers the sharp corners 16. The source region 24 and the drain region 26 are located in the substrate 10 beside the gate conductor 22. A surface portion of the substrate 10 along the sidewalls and the bottom of the trench 28 acts as a channel region.

Figure 1D:
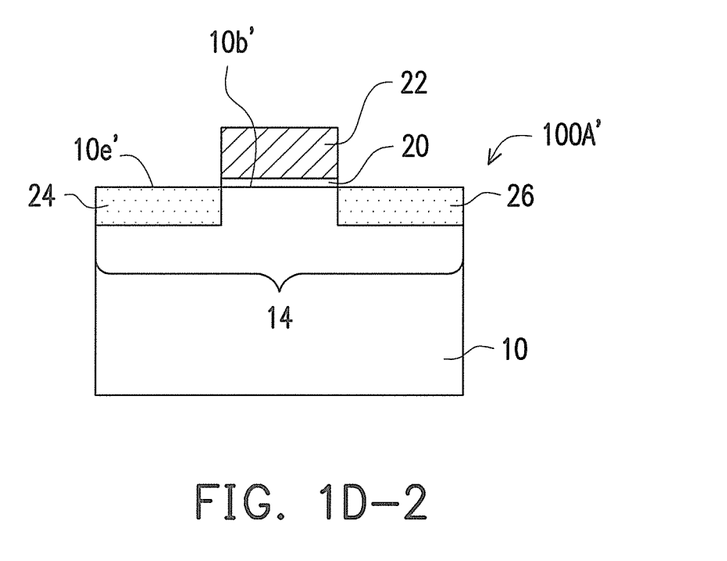

Besides, it is possible that the substrate regions for forming the source region 24 and the drain region 26 are not masked by a mask layer before the treating process. In such a case, the substrate regions for forming the source region 24 and the drain region 26 are also oxidized in the treating process, so that in the resulting corner transistor 100A', the top surfaces 10e' of the source region 24 and the drain region 26 are coplanar with the top surface 10b' of the substrate 10 between them, as shown in FIG. 1D-2.

Figure 2A:
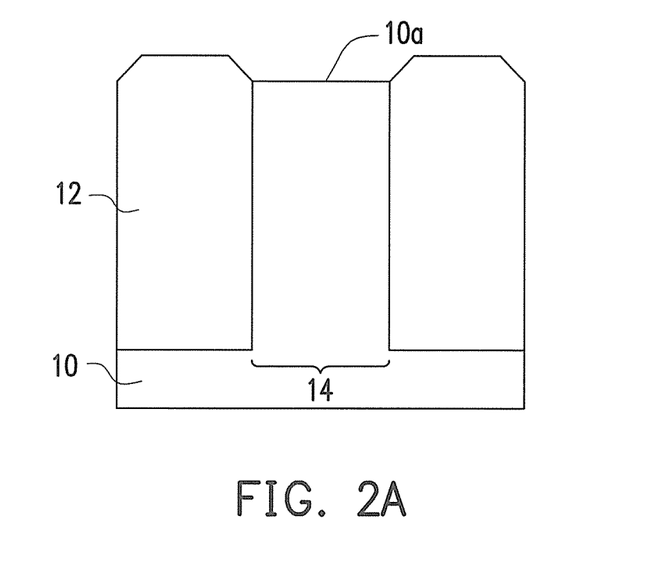
FIGS. 2A-2C illustrate a method of fabricating a corner transistor according to a second embodiment of this invention, in a cross-sectional view along line I-I in FIG. 1.
Figure 2B:
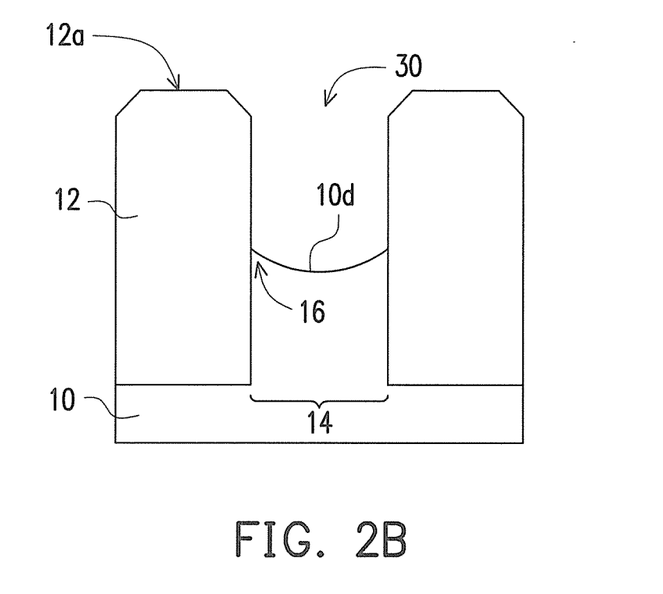
Figure 2C:
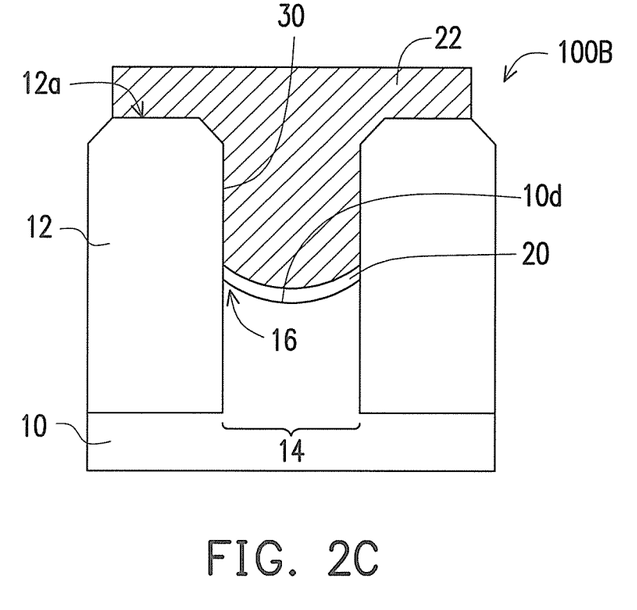

FIGS. 2A-2C illustrate a method of fabricating a corner transistor according to a second embodiment of this invention, in a cross-sectional view along the line I-I in FIG. 1. FIG. 2C-1 illustrates, in a cross-sectional view along the line II-II in FIG. 1, the corner transistor according to the second embodiment.

Referring to FIGS. 2A-2B, an isolation structure 12 is formed in the substrate 10 to define an active area 14 (FIG. 2A) as above. After the substrate regions for forming the source region 24 and the drain region 26 are masked by a mask layer (not shown), a different treating process for forming sharp corners is performed. The treating process includes only one stage that includes a first etching process (FIG. 2B), which removes a portion of the substrate 10 in the active area 14 such that the top surface 10d of the remaining substrate 10 in the active area 14 is sufficiently lower than the surface 12a of the isolation structure 12 and a trench 30 is formed thereby. The first etching process includes an anisotropic etching process that may be a dry etching process.

Figure 2C:
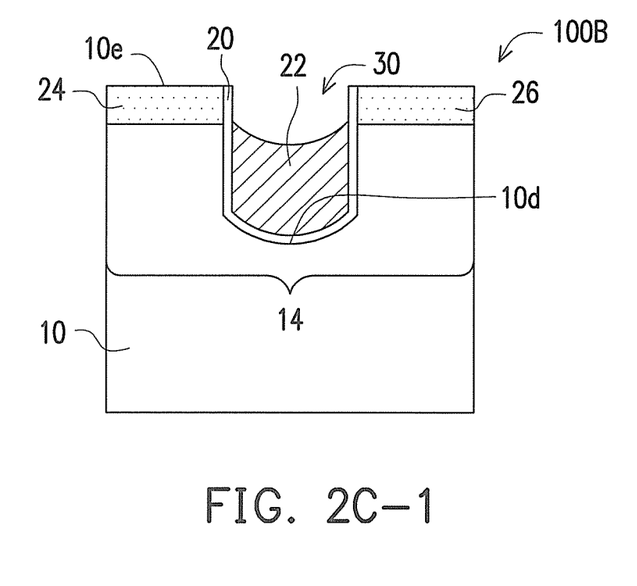

Referring to FIGS. 1, 2C and 2C-1, a gate dielectric layer 20 is then formed over the substrate 10 at the bottom of the trench 30 with the above-mentioned method. A patterned gate conductor 22 is formed over the gate dielectric layer 20 and the isolation structure 12. A source region 24 and a drain region 26 are then formed in the substrate 10 beside the gate conductor 22.

The corner transistor 100B formed in the second embodiment similarly includes a substrate 10, a gate dielectric layer 20, a gate conductor 22, a source region 24 and a drain region 26, but the top surface 10d of the substrate 10 between the source region 24 and the drain region 26 not only is lower than the top surfaces 10e of the source region 24 and the drain region 26 but also is lower than the top surface 12a of the isolation structure 12. The trench 30 exposes the top surface 10d of the substrate 10 in the active area 14 before the gate dielectric layer 20 is formed.

In a modified version of the second embodiment of this invention, the treating process includes three stages. Specifically, the procedure of the first embodiment as illustrated in FIGS. 1A-1C, which includes the above-mentioned first and second stages of the treating process of the first embodiment, is performed to form the isolation structure 12 defining the active area 14 and make the top surface 10b of the substrate 10 in the active area 14 and the sharp corners 16 protrudent over the surface of the isolation structure 12. The third stage of the modified treating process is the above-mentioned first etching process, and is not described again.

Figure 3A:
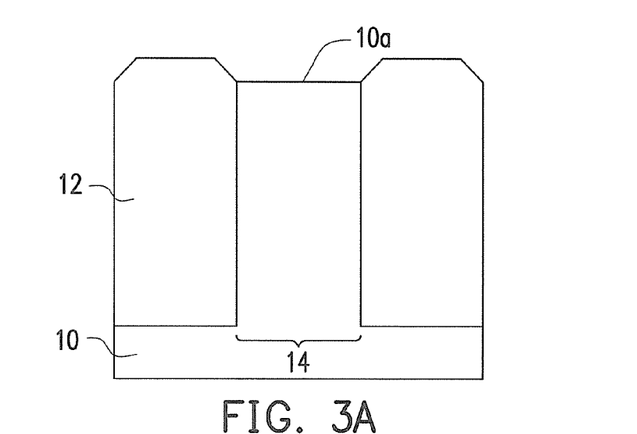
FIGS. 3A-3D illustrate a method of fabricating another corner transistor according to the second embodiment of this invention, in a cross-sectional view along the line I-I in FIG. 1.
Figure 3B:
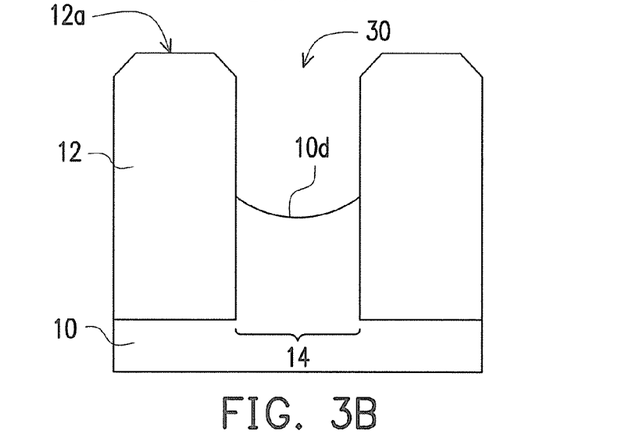
Figure 3C:
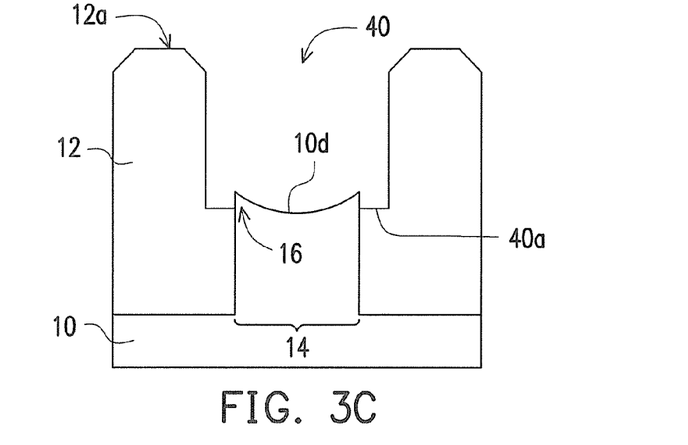
Figure 3D:
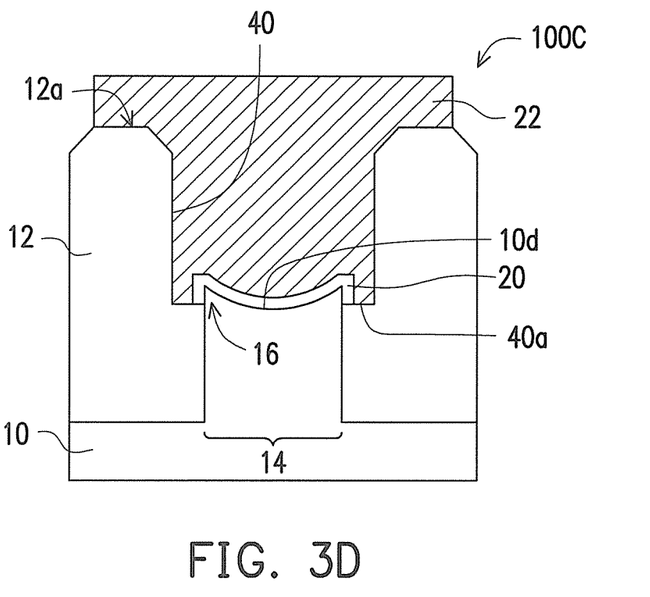

FIGS. 3A-3D illustrate a method of fabricating another corner transistor according to the second embodiment of this invention, in a cross-sectional view along the line I-I in FIG. 1. FIG. 3D-1 illustrates, in a cross-sectional view along the line II-II in FIG. 1, the another corner transistor according to the second embodiment.

Referring to FIGS. 3A-3B, an isolation structure 12 is formed in the substrate 10 to define an active area 14 (FIG. 3A) as above. After the substrate regions for forming the source region 24 and the drain region 26 are masked by a mask layer (not shown), the first etching process in the treating process is performed to remove a portion of the substrate 10 between the two portions of the isolation structure 12 and form a trench 30.

Referring to FIG. 3C, the second etching process in the treating process is performed to remove a portion of the isolation structure 12 at the sidewalls of the trench 30 and thereby form a wider trench 40. Thus, the top surface 10d of the substrate 10 in the active area 14 and the sharp corners 16 are protrudent over the bottom 40a of the trench 40. The second etching process may be an isotropic etching process, such as a wet etching process.

Figure 3D:
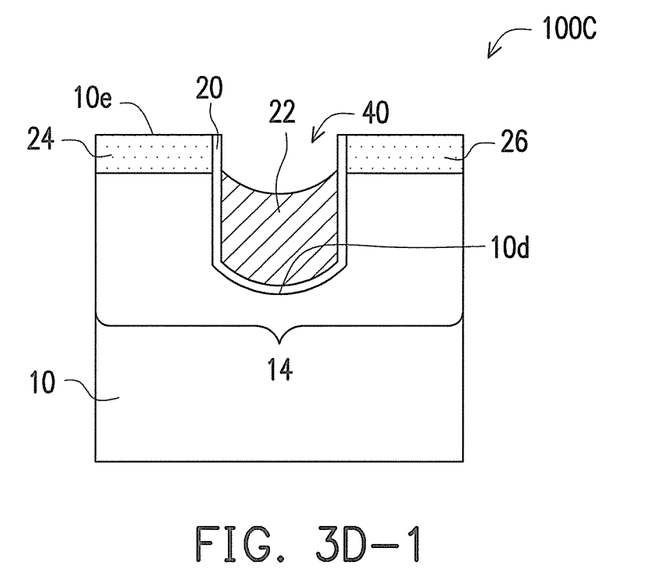

Referring to FIGS. 1, 3D and 3D-1, a gate dielectric layer 20 is then formed over the substrate 10 covering the top surface 10d of the substrate 10 and the sharp corners 16 exposed at the bottom 40a of the trench 40. A patterned gate conductor 22 is formed over the gate dielectric layer 20 and the isolation structure 12. A source region 24 and a drain region 26 are then formed in the substrate 10 beside the gate conductor 22.

The corner transistor 100C formed as above similarly includes a substrate 10, a gate dielectric layer 20, a gate conductor 22, a source region 24 and a drain region 26, wherein the top surface 10d of the substrate 10 between the source region 24 and the drain region 26 not only is lower than the top surfaces 10e of the source region 24 and the drain region 26 but also is lower than the top surface 12a of the isolation structure 12 as above. The difference thereof from the above corner transistor (100B) according to the second embodiment is that the top surface 10d of the substrate 10 in the active area 14 and the sharp corners 16 are protrudent over the bottom 40a of the trench 40.

According to the above embodiments, the method of this invention uses a simple process to fabricate a corner transistor. The substrate between the source region and the drain region has sharp corners so that the gate conductor covers sharp corners to improve the device performance. Meanwhile, the gate conductor of the transistor can be disposed in a trench to allow easy reduction of the device size.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of fabricating a corner transistor, comprising:
    forming an isolation structure in a substrate to define an active area;
    performing a treating process to make the substrate in the active area have sharp corners at top edges thereof;
    covering the substrate in the active area by a gate dielectric layer;
    forming a gate conductor over the gate dielectric layer; and
    forming a source region and a drain region in the substrate beside the gate conductor, wherein a top surface of the gate conductor is lower than a top surface of the source region and a top surface of the drain region.

2. The method of claim 1, wherein the treating process comprises:
    making a top surface of the substrate in the active area have a curved shape.

3. The method of claim 1, wherein the treating process comprises:
    performing a thermal oxidation process to oxidize a surface of the substrate in the active area and form an oxide layer with a curved profile; and
    removing the oxide layer and a portion of the isolation structure so that the surface of the substrate in the active area and the sharp corners are protrudent over a surface of the remaining isolation structure.

4. The method of claim 3, wherein the gate dielectric layer also covers the sharp corners.

5. The method of claim 3, wherein the treating process further comprises:
    performing a first etching process to remove a portion of the substrate in the active area, such that a surface of the remaining substrate in the active area is lower than the surface of the remaining isolation structure and a trench is formed thereby.

6. The method of claim 5, wherein the first etching process comprises an anisotropic etching process.

7. The method of claim 5, wherein the treating process further comprises:
    performing a second etching process to remove a portion of the isolation structure at sidewalls of the trench so that the surface of the remaining substrate in the active area and the sharp corners are protrudent over a bottom of the trench.

8. The method of claim 7, wherein the second etching process comprises an isotropic etching process.

9. The method of claim 7, wherein the gate dielectric layer also covers the sharp corners.

10. The method of claim 1, wherein the treating process comprises:
    performing a first etching process to remove a portion of the substrate in the active area, such that a surface of the remaining substrate in the active area is lower than a surface of the isolation structure and a trench is formed thereby.

11. The method of claim 10, wherein the first etching process comprises an anisotropic etching process.

12. The method of claim 10, wherein the treating process further comprises:
performing a second etching process to remove a portion of the isolation structure at sidewalls of the trench so that the surface of the remaining substrate in the active area and the sharp corners are protrudent over a bottom of the trench.

13. The method of claim 12, wherein the second etching process comprises an isotropic etching process.

14. The method of claim 12, wherein the gate dielectric layer also covers the sharp corners.

15. A corner transistor, comprising:
a substrate, having therein an isolation structure defining an active area, wherein the substrate in the active area have sharp corners at two edges thereof;
a gate dielectric layer, covering the substrate in the active area;
a gate conductor over the gate dielectric layer; and
a source region and a drain region in the substrate beside the gate conductor, wherein a top surface of the gate conductor is lower than a top surface of the source region and a top surface of the drain region.

16. The corner transistor of claim 15, wherein a top surface of the substrate in the active area and the sharp corners are protrudent over a surface of the isolation structure.

17. The corner transistor of claim 15, wherein a top surface of the substrate in the active area is lower than a top surface of the isolation structure so that a trench is formed exposing the top surface of the substrate in the active area.

18. The corner transistor of claim 15, wherein a top surface of the substrate in the active area is lower than a top surface of the isolation structure so that a trench is formed, and the surface of the substrate in the active area and the sharp corners are protrudent over a bottom of the trench.

19. The corner transistor of claim 18, wherein the gate dielectric layer also covers the sharp corners.

20. The corner transistor of claim 15, wherein a top surface of the substrate in the active area has a curved shape.

* * * * *